United States Patent
Pasolini et al.

(10) Patent No.: US 6,876,566 B2
(45) Date of Patent: Apr. 5, 2005

(54) DIFFERENTIAL NON-VOLATILE MEMORY DEVICE AND BIT READING METHOD FOR THE SAME

(75) Inventors: Fabio Pasolini, San Martino Siccomario (IT); Michele Tronconi, Travaco' Siccomario (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/792,033

(22) Filed: Mar. 3, 2004

(65) Prior Publication Data

US 2004/0190346 A1 Sep. 30, 2004

(30) Foreign Application Priority Data

Mar. 4, 2003 (IT) ...................................... MI2003A0384

(51) Int. Cl.[7] ................................................ G11C 7/00
(52) U.S. Cl. .......................... 365/96; 365/207; 365/208
(58) Field of Search ........................... 365/96, 205, 207, 365/208, 225.7

(56) References Cited

U.S. PATENT DOCUMENTS 4,787,047 A * 11/1988 Wei .............................. 326/38
5,949,703 A * 9/1999 Shibata et al. .............. 365/103
6,430,101 B1 * 8/2002 Toda ........................ 365/225.7

* cited by examiner

Primary Examiner—Vu A. Le
(74) Attorney, Agent, or Firm—Lisa K. Jorgenson; Stephen Bongini; Fleit, Kain, Gibbons, Gutman, Bongini & Bianco P.L.

(57) ABSTRACT

A differential non-volatile memory device is provided that includes setting means, at least first and second OTP memory cells that are each coupled between a supply voltage and a reference voltage, and a read circuit forming a first current path between the first memory cell and the reference voltage and a second current path between the second memory cell and the reference voltage for reading the bit and the complementary bit that are stored in the first and second memory cells. The first current path includes a first circuit point that is associated with a first output terminal, and the second current path includes a second circuit point that is associated with a second output terminal. The setting means can be activated to bring the first and second circuit points to a voltage value that is substantially equal to the reference voltage, and is able to set the value of the current flowing through each of the first and second current paths. Also provided is a method for reading such a differential non-volatile memory device.

12 Claims, 2 Drawing Sheets

DIFFERENTIAL NON-VOLATILE MEMORY DEVICE AND BIT READING METHOD FOR THE SAME

CROSS-REFERENCE TO RELATED APPLICATIONS

This application is based upon and claims priority from prior Italian Patent Application No. MI2003A 000384, filed Mar. 4, 2003, the entire disclosure of which is herein incorporated by reference.

BACKGROUND OF THE INVENTION

1. Field of the Invention

The present invention relates to memory devices, and more particularly to a differential non-volatile memory device and a bit reading method for such a memory device.

2. Description of Related Art

Conventional differential non-volatile memory devices have memory cells of the OTP (One Time Programmable) type (i.e., memory cells that are programmed only once and which do not lose the stored information when the memory device is no longer supplied with power).

Such a memory device is shown in FIG. 1. The device comprises two memory blocks 100 and 200 having memory cells 1 and 2, which are formed by respective capacitors C1 and C2, and driving MOS transistors M1 and M2. Each of the capacitors C1 and C2 is connected between a supply voltage HV having a high value and the drain terminal of one of the driving transistors M1 and M2, which has its source terminal connected with a reference voltage, which is generally ground. During the programming of the memory cells 1 and 2, one of the two capacitors C1 and C2 is altered. That is, a high potential difference is applied at its terminals, until it assumes the properties of a resistor (known as "antifuse" programming). In the programming, the supply voltage HV is typically about 14V and, in the case in which the capacitor C1 has to be altered, the MOS transistor M1 is turned on so that a potential difference of about 14V is applied at the terminals of the capacitor C1; the MOS transistor M2 in such a case is turned off.

It is alternatively possible to program the memory cells of a differential non-volatile memory device by using a "fuse" approach. In such a case, two resistances are put in the place of the two capacitors C1 and C2, and one of the resistances is altered by a high potential difference at its terminals so as to obtain a capacitor.

A memory device provided with two memory cells with one having a capacitive behavior (e.g., the memory cell 2 of the device of FIG. 1) and the other having a resistive behavior (e.g., the memory cell 1 of the device of FIG. 1) stores only one bit and its complementary bit. At the end of the programming, both the driving transistors M1 and M2 are turned off.

During reading, a reading circuit 3 is activated by a control signal READ that simultaneously turns on transistors M3 and M4, which are connected respectively with the drain terminals of the transistors M1 and M2 at the circuit points C and D, respectively. The supply voltage HV assumes a low voltage value typically of about 5V during the reading.

Successively, a pre-charge step occurs in which the transistors M5 and M6, which have their source terminals connected with the respective source terminals of the transistors M1 and M2 (in this case that means connected to ground), and their drain terminals connected with the source terminals of the transistors M3 and M4, are turned on by a control signal P applied at their gate terminal. In such a way, a path is formed between the supply HV and ground. In the memory device of FIG. 1, the circuit points A and B can be distinguished as follows. The circuit point A is formed by the source terminal of the transistor M3, the drain terminal of the transistor M5, the input terminal of a buffer B1, and one of two input terminals of a device 4 that has a high impedance at its input terminals and that is turned off during the pre-charge step. The circuit point B is formed by the source terminal of the transistor M4, the drain terminal of the transistor M6, the input terminal of a buffer B2, and the other input terminal of the device 4. The pre-charging causes the circuit points A and B to assume equal voltages (in this case the ground voltage, and in general the lowest voltage applied to the memory device).

At the end of the pre-charge step, the transistors M5 and M6 are turned off while the transistors M3 and M4 are turned on. This causes the circuit points A and B to become high impedance points and have different behaviors. Since the capacitor C1 has resistive properties, the voltage at the circuit point A will assume a value substantially equal to the supply voltage HV, while the voltage at the circuit point B is constant with a value substantially equal to ground.

After a time period necessary for the circuit points A and B to assume different voltage values, the device 4 is activated. The device is a discriminator which amplifies the voltage difference between the circuit points A and B.

At the end, the bit 1 and its complementary bit, the bit 0, are obtained at the output terminals Out1 and Out2 of the inverting buffers B1 and B2. In accordance with the selected convention, the bit 1 or its complementary bit can be linked to the memory cell 1 having resistive behavior.

In such a memory device, in the pre-charge step a resistive path between supply and ground occurs which causes a considerable power loss that is limited only by the on resistances of the transistors M3 and M4 and by the resistive value of the memory cell 1 having resistive behavior.

A solution to this drawback can be to put into the memory device of FIG. 1 two further resistances for limiting the power loss. These resistances can be connected, for example, with the drain terminals of the transistors M3 and M4 and the circuit points C and D in FIG. 1.

Nevertheless, the use of these additional resistances increases the bit reading time and also increases the area occupied in the memory device chip. In the case in which there are a great number of bits, this increase in the occupied area becomes considerable.

SUMMARY OF THE INVENTION

It is an object of the present invention to provide a differential non-volatile memory device that overcomes the above-mentioned drawbacks.

One embodiment of the present invention provides a differential non-volatile memory device that includes setting means, at least first and second OTP memory cells that are each coupled between a supply voltage and a reference voltage, and a read circuit forming a first current path between the first memory cell and the reference voltage and a second current path between the second memory cell and the reference voltage for reading the bit and the complementary bit that are stored in the first and second memory cells. The first current path includes a first circuit point that is associated with a first output terminal, and the second current path includes a second circuit point that is associated with a second output terminal. The setting means can be activated to bring the first and second circuit points to a voltage value that is substantially equal to the reference voltage, and is able to set the value of the current flowing through each of the first and second current paths.

Another embodiment of the present invention provides a method for reading such a differential non-volatile memory device. According to the method, the first and second circuit points are brought to about the reference voltage, and a current flowing through each of the first and the second current paths is set so as to control the currents flowing through the first and second current paths. Subsequently, one of the first and second circuit points is brought to about the supply voltage and the other of the first and second circuit points is maintained at about the reference voltage.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
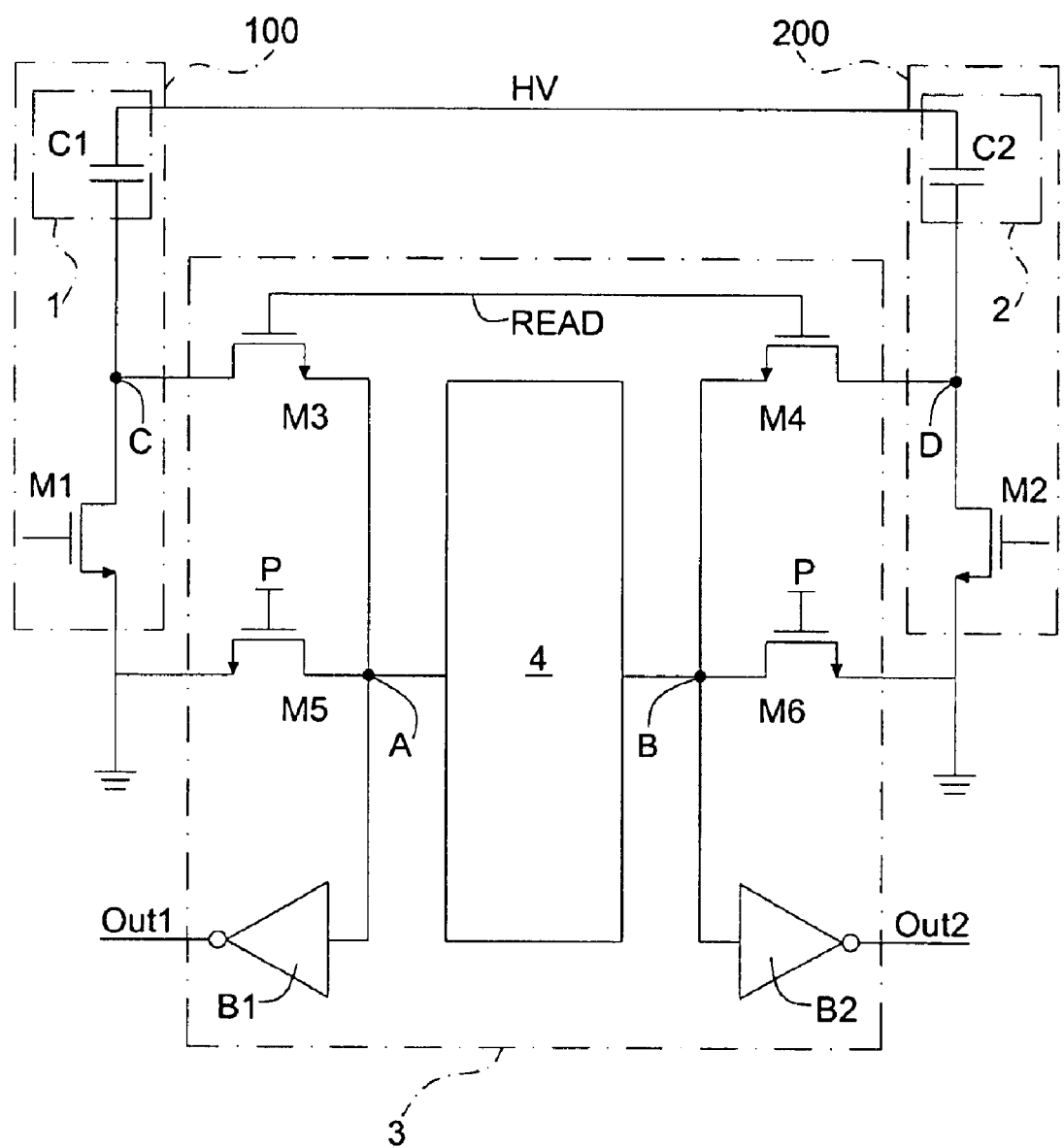
FIG. 1 is a circuit diagram of a conventional differential non-volatile memory device.
Figure 2:
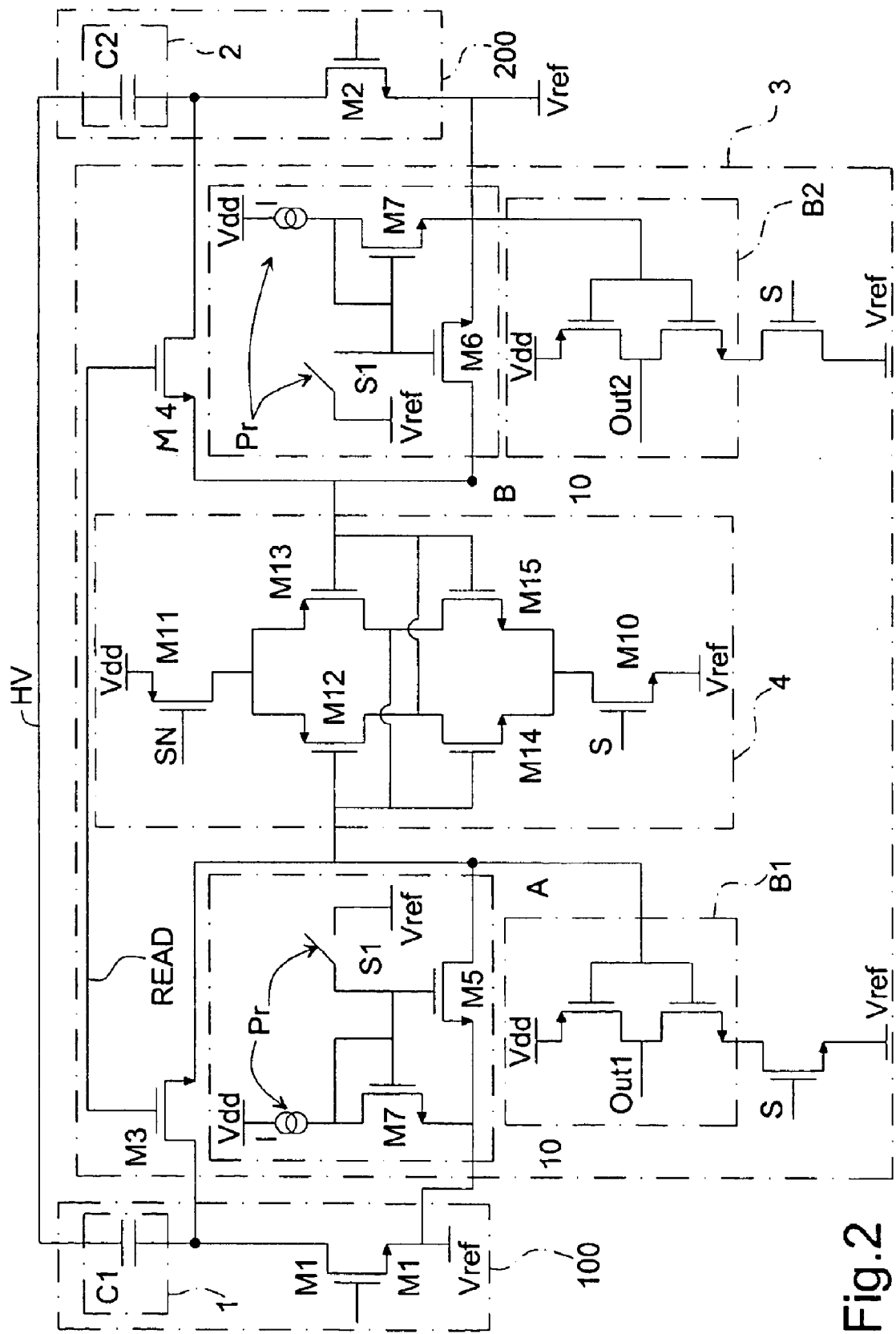
FIG. 2 is a circuit diagram of a differential non-volatile memory device according to a preferred embodiment of the present invention.

FIG. 2 shows a circuit diagram of a memory device according to a preferred embodiment of the present invention. The numerical references in FIG. 2 that represent the same elements as those in the circuit of FIG. 1 are not changed. The memory device of FIG. 2 comprises two memory blocks 100 and 200 that include memory cells 1 and 2, which are formed by respective capacitors C1 and C2, and driving MOS transistors M1 and M2. Each of the capacitors C1 and C2 is connected between a supply voltage HV having a high value and the drain terminal of one of the driving transistors M1 and M2, which has its source terminal connected with a reference voltage Vref, which is ground in this embodiment. During the programming of the memory cells 1 and 2, one of the two capacitors C1 and C2 is altered. That is, a high potential difference is applied at its terminals, until it assumes the properties of a resistor (known as "antifuse" programming). In the programming in this embodiment, the supply voltage HV is about 14V and, in the case in which the capacitor C1 has to be altered, the MOS transistor M1 is turned on so that a potential difference of about 14 V is applied at the terminals of the capacitor C1; the MOS transistor M2 in such case is turned off.

In an alternative embodiment, the memory cells are programmed by using a "fuse" approach. In such an embodiment, two resistances are put in the place of the two capacitors C1 and C2, and one of the resistances is altered by a high potential difference at its terminals so as to obtain a capacitor.

The memory device of FIG. 2, which is provided with two memory cells with one having a capacitive behavior (e.g., the memory cell 2 of the device of FIG. 2) and the other having a resistive behavior (e.g., the memory cell 1 of the device of FIG. 2), stores only one bit and its complementary bit. At the end of the programming, both the driving transistors M1 and M2 are turned off.

During reading, a reading circuit 3 is activated by a control signal READ that simultaneously turns on transistors M3 and M4, which are connected respectively with the drain terminals of the transistors M1 and M2 and with the memory cells 1 and 2. The supply voltage HV assumes a low voltage value (of about 5V in this embodiment).

Successively, a pre-charge step occurs in which the transistors M5 and M6, which have their source terminals connected with the respective source terminals of the transistors M1 and M2 (i.e., connected with the reference voltage Vref, in this embodiment the ground voltage), and their drain terminals connected with the source terminals of the transistors M3 and M4, are activated. The transistors M5 and M6 belong to devices 10 that are adapted to set the current flowing through the paths 11 and 12 which are formed through each memory cell 1 and 2, which is connected with the supply voltage HV and ground.

Each device 10 includes the transistor M5 or M6, which is inserted in the respective path 11 or 12, and a further transistor M7 that forms a current mirror with the transistor M5 or M6. In fact, the transistor M7 has its drain terminal connected with a current generator I that is connected with a supply voltage Vdd, its gate terminal connected with its drain terminal and with the gate terminal of the transistor M5 or M6, and its source terminal connected with the reference voltage Vref (ground in this embodiment). The devices 10 set the current flowing through the paths 11 and 12 to decrease the power consumption of the whole device in the pre-charge step. The devices 10 have to be active only in the pre-charge step. For this purpose, they can each comprise a switch S1 placed between the common gate terminals of the transistor M5 or M6 and transistor M7 and the reference voltage Vref (ground in this embodiment). The switches S1 are controlled by a control signal Pr that is provided so as to open them only in the pre-charge step and to close them in the other steps, thereby bringing the gate terminals of the transistor M5 or M6 and transistor M7 to ground. The same control signal Pr activates the current generator I in the pre-charge step and inactivates it in the other steps.

In the memory device of FIG. 2, the circuit points A and B can be distinguished as follows. The circuit point A is formed by the source terminal of the transistor M3, the drain terminal of the transistor M5, the input terminal of a buffer B1, and one of two input terminals of a device 4 that has a high impedance at its input terminals and that is turned off during the pre-charge step. The circuit point B is formed by the source terminal of the transistor M4, the drain terminal of the transistor M6, the input terminal of a buffer B2, and the other input terminal of the device 4. The pre-charging causes the circuit points A and B assume equal voltages (in this embodiment the ground voltage, and in general the lowest voltage applied to the memory device).

At the end of the pre-charge step, the transistors M5 and M6 are turned off while the transistors M3 and M4 are turned on. This causes the circuit points A and B to become high impedance points and have different behaviors. Since the capacitor C1 has resistive properties, the voltage at the circuit point A will assume a value substantially equal to the supply voltage HV, while the voltage at the circuit point B is constant with a value substantially equal to the reference voltage (ground in this embodiment).

After a time period necessary for the circuit points A and B to assume different voltage values, the device 4 is activated. The device is a discriminator which amplifies the voltage difference between the circuit points A and B.

The device 4 comprises an NMOS transistor M10 on which the control signal S acts, and a PMOS transistor M11 on which a control signal SN acts, which is the complementary signal of the signal S. The transistor M10 has its source terminal connected with the reference voltage Vref (ground in this embodiment) and its drain terminal connected with the common source terminal of two other NMOS transistors M14 and M15, which have their gate terminals respectively connected with the circuit points A and B. The transistor M11 has its source terminal connected with the supply voltage Vdd (for example, of 5V in this embodiment) and its drain terminal connected with the common source terminal of two other PMOS transistors M12 and M13, which have their gate terminals connected respectively with the circuit points A and B. The drain terminals of the transistors M12 and M14 are in common and are connected with the circuit point B, while the drain terminals of the transistors M13 and M15 are in common and are connected with the circuit point A.

When the transistors M10 and M11 are active, in the case in which the voltage at the circuit point B is such as to turn on the transistor M15 and the voltage at the circuit point A is such as to turn on the transistor M12, the transistor M15 maintains the circuit point A at ground and the transistor M12 makes high the voltage at the circuit point B (to the voltage Vdd). If instead the voltage at the circuit point A is such as to turn on the transistor M14 and the voltage at the circuit point B is such as to turn on the transistor M13, the transistor M14 maintains the circuit point B at ground and the transistor M13 makes high the voltage at the circuit point A (to the voltage Vdd).

At the end, the bit 1 and its complimentary bit, the bit 0, are obtained at the output terminals Out1 and Out2 of the inverting buffers B1 and B2. In accordance with the selected convention, the bit 1 or its complementary bit can be linked to the memory cell 1 having resistive behavior.

Preferably, a control signal (or control circuitry) is provided for inactivating the buffers B1 and B2 during the pre-charge step and for activating them during the activation step of the device 4. Such a control signal can be equal to the control S of the device 4. For example, in the embodiment of FIG. 2, the inverting buffers are represented by two inverters, each one formed by a couple of MOS transistors, one PMOS and the other NMOS. Another NMOS transistor controlled by the control signal S activates or inactivates the buffers.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A differential non-volatile memory device comprising:

at least first and second OTP memory cells that are each coupled between a supply voltage and a reference voltage, the first and second memory cells being programmed to store a bit and its complementary bit;

a read circuit forming a first current path between the first memory cell and the reference voltage and a second current path between the second memory cell and the reference voltage for reading the bit and the complementary bit that are stored in the first and second memory cells, the first current path including a first circuit point that is associated with a first output terminal, and the second current path including a second circuit point that is associated with a second output terminal; and setting means that can be activated to bring the first and second circuit points to a voltage value that is substantially equal to the reference voltage, the setting means being able to set the value of the current flowing through each of the first and second current paths.

2. The memory device according to claim 1, wherein the setting means comprises a current mirror that includes:

a current reference;

at least one first transistor coupled to the current reference; and at least two second transistors, each of the second transistors being in one of the first and second current paths.

3. The memory device according to claim 1, further comprising first and second buffers, the first buffer being coupled between the first circuit point and the first output terminal, and the second buffer being coupled between the second circuit point and the second output terminal.

4. The memory device according to claim 1, further comprising a device coupled to the first and second circuit points for amplifying a voltage difference between the first and second circuit points after inactivation of the setting means.

5. The memory device according to claim 1, wherein the reference voltage is ground.

6. The memory device according to claim 1, further comprising a control circuit for activating setting means, and then inactivating the setting means and bringing one of the first and second circuit points to about the supply voltage and maintaining the other of the first and second circuit points at about the reference voltage.

7. An information processing system that includes at least one differential non-volatile memory device, the memory device comprising:

at least first and second OTP memory cells that are each coupled between a supply voltage and a reference voltage, the first and second memory cells being programmed to store a bit and its complementary bit;

a read circuit forming a first current path between the first memory cell and the reference voltage and a second current path between the second memory cell and the reference voltage for reading the bit and the complementary bit that are stored in the first and second memory cells, the first current path including a first circuit point that is associated with a first output terminal, and the second current path including a second circuit point that is associated with a second output terminal; and setting means that can be activated to bring the first and second circuit points to a voltage value that is substantially equal to the reference voltage, the setting means being able to set the value of the current flowing through each of the first and second current paths.

8. The information processing system according to claim 7, wherein the setting means of the memory device comprises a current mirror that includes:

a current reference;

at least one first transistor coupled to the current reference; and at least two second transistors, each of the second transistors being in one of the first and second current paths.

9. The information processing system according to claim 7, wherein the memory device further comprises first and second buffers, the first buffer being coupled between the first circuit point and the first output terminal, and the second buffer being coupled between the second circuit point and the second output terminal.

10. The information processing system according to claim 7, wherein the memory device further comprises a device coupled to the first and second circuit points for amplifying a voltage difference between the first and second circuit points after inactivation of the setting means.

11. The information processing system according to claim 7, wherein the reference voltage is ground.

12. The information processing system according to claim 7, wherein the memory device further comprises a control circuit for activating setting means, and then inactivating the setting means and bringing one of the first and second circuit points to about the supply voltage and maintaining the other of the first and second circuit points at about the reference voltage.

* * * * *